United States Patent [19]

Yamaguchi et al.

[11] Patent Number: 5,264,726
[45] Date of Patent: Nov. 23, 1993

[54] CHIP-CARRIER

[75] Inventors: Yukio Yamaguchi; Mutsuo Tsuji, both of Tokyo, Japan

[73] Assignee: NEC Corporation, Tokyo, Japan

[21] Appl. No.: 962,074

[22] Filed: Oct. 16, 1992

Related U.S. Application Data

[63] Continuation of Ser. No. 554,412, Jul. 19, 1990, abandoned.

[30] Foreign Application Priority Data

Jul. 21, 1989 [JP] Japan .................. 1-187552
Feb. 13, 1990 [JP] Japan .................. 2-32087
Feb. 22, 1990 [JP] Japan .................. 2-42933

[51] Int. Cl.5 .............. H01L 23/02; H01L 23/12
[52] U.S. Cl. ........................ 257/687; 257/729; 257/731
[58] Field of Search ............. 357/29, 74, 81, 84; 257/687, 729, 731

[56] References Cited

U.S. PATENT DOCUMENTS 4,541,003  9/1985  Otsuka et al. .................. 357/74
4,855,869  8/1989  Tsaji ............................. 361/386

FOREIGN PATENT DOCUMENTS 0114106  7/1984  European Pat. Off. .
0214621  3/1987  European Pat. Off. .
260-969    3/1988  European Pat. Off. ........ 357/74
55-130149 10/1980  Japan ............................ 357/84
58-4954    1/1983  Japan ............................ 357/84
59-031045  2/1984  Japan .
62-062545  3/1987  Japan .
62-213144  9/1987  Japan ............................ 357/74
62-250650 10/1987  Japan ............................ 357/80
63-090843  4/1988  Japan .
63-229726  9/1988  Japan .
1-077148   3/1989  Japan .
1-124249   5/1989  Japan ............................ 357/74
2039145    7/1980  United Kingdom .
2067013    7/1981  United Kingdom .

Primary Examiner—Jerome Jackson
Assistant Examiner—D. Monin
Attorney, Agent, or Firm—Burns, Doane, Swecker & Mathis

[57] ABSTRACT

In a chip-carrier provided with a chip-carrier substrate, a chip-carrier cover and an IC chip, said IC chip being arranged at a distance from a circuit surface of the IC chip being directed toward the chip-carrier substrate, an α-ray shielding film made of film material containing few radioactive elements, and adhered to a surface of the chip-carrier substrate facing the IC chip or to the circuit surface of the IC chip is provided for protecting the IC chip from the IC chip.

2 Claims, 2 Drawing Sheets

CHIP-CARRIER

This application is a continuation of application Ser. No. 07/554,412, filed Jul. 19, 1990, now abandoned.

BACKGROUND OF THE INVENTION

The present invention relates to a chip-carrier, and especially relates to a chip-carrier having means for preventing soft error caused by α-ray, and also the present invention relates to a semiconductor device of chip-carrier type and a semiconductor device having TAB IC, mounted on printed circuit board for preventing soft error caused by α-ray.

For example, in case of a high degree of integration of a dynamic MOS memory, there are cases where error is not reproduced, which is called soft error and is caused by α-ray radiated from a very small amount of radioactive material contained in a package.

Conventionally, in order to prevent the information stored in a memory cell of an IC chip from being destroyed by α-ray radiated from a chip-carrier package, a circuit surface of IC chip was protected by a coating layer of α-ray shielding resin. In this case, high viscous silicone resins was used as α-ray shielding resin, and the silicon resin was applied on the circuit surface of an IC chip by potting, prior to packaging of the IC chip in a chip-carrier package. The chip-carrier package is comprised of a chip-carrier substrate provided with bumps to be connected with printed circuit of printed wiring board (not shown), a chip-carrier cover having inverted "U" shape in cross section, which chip-carrier cover is adjoined to the chip-carrier substrate so that a hollow part for accommodating an IC chip is formed. The IC chip is mounted on the chip-carrier substrate face down through lead-formed leads. In order to assemble the chip-carrier by using such a chip-carrier package, first, α-ray shielding resin is dropped on circuit surface of an IC chip and heat-cured by means of potting equipment. Therefore there are cases where α-ray shielding silicone resin is protruded into a shape of a mountain to such an extent that the protruded silicone resin makes lead forming difficult. Further when dropped silicone resin on the IC chip is heat-cured, heat is applied to the IC chip, thereby lowering the reliability of the IC chip.

SUMMARY OF THE INVENTION

It is an object of the present invention to provide a chip-carrier wherein lead forming of the IC chip can be carried out simply and reliability of the IC chip can be improved.

The above object of the present invention is attained by a chip-carrier comprising a chip-carrier substrate, a chip-carrier cover and an IC chip, having a circuit surface directed toward the chip-carrier substrate and being die-bonded to the chip-carrier cover and being arranged at a distance from the chip-carrier substrate, leads rising between the circuit surface of the IC chip and the chip-carrier substrate and being connected with the IC chip and the chip-carrier substrate, and an α-ray shielding film made of film material containing few radioactive elements adhered to at least one of the circuit surface of the IC chip and a surface of the chip-carrier substrate facing the IC chip through an adhesive layer.

Further, the above object of the present invention is attained by a chip-carrier comprising a chip-carrier substrate, a chip-carrier cover and an IC chip, said IC chip being arranged at a distance from the chip-carrier substrate through lead-formed leads with a circuit surface of the IC chip being directed toward the chip-carrier substrate, connected through the leads to pads provided on the chip-carrier substrate, and die-bonded to the chip-carrier cover, the chip-carrier comprises an α-ray shielding film made of film material containing few radioactive elements, and adhered to the circuit surface of the IC chip through an adhesive layer containing few radioactive elements.

Further, the above object of the present invention is attained by a chip-carrier comprising a chip-carrier substrate, a chip-carrier cover and an IC chip, said IC chip being arranged at a distance from the chip-carrier substrate through lead-formed leads with a circuit surface of the IC chip being directed toward the chip-carrier substrate, connected through the leads to pads provided on the chip-carrier substrate, and die-bonded to the chip-carrier cover, the chip-carrier comprises a spacer interposed between the IC chip and the chip-carrier substrate and made to come closely into contact with the whole circuit surface of the IC chip, said spacer being formed of rubber sheet and having an α-ray shielding coating film made of coating material containing few radioactive elements on the surface of the spacer facing the IC chip, and said spacer being adhered to the chip-carrier substrate through an adhesive layer.

Furthermore, the object of the present invention is attained by a chip-carrier comprising a chip-carrier substrate, a chip-carrier cover and an IC chip, said IC chip being arranged away form the chip-carrier substrate through lead-formed leads with a circuit surface of the IC chip being directed toward the chip-carrier substrate, connected through the leads to pads provided on the chip-carrier substrate, and die-bonded to the chip-carrier cover, the chip-carrier comprises a spacer interposed between the IC chip and the chip-carrier substrate and made to come closely into contact with the whole circuit surface of the IC chip, said spacer being formed of α-ray shielding rubber sheet containing few radioactive elements, and adhered to the chip-carrier substrate through an adhesive layer.

In the present invention, the α-ray shielding film, and the adhesive layer between the IC chip and the α-ray shielding film should be selected on the criterion of α-ray dose less than 0.001 count/cm$^2$·hrs. Further the α-ray shielding film should have a thickness more than 50 μm. Furthermore when the α-ray shielding film is provided on a surface of the chip-carrier substrate facing the IC chip, the α-ray shielding film should have an area greater than an area of the circuit surface of the IC chip.

In the present invention, the spacer provided between the IC chip and the chip-carrier substrate should be made to come closely into contact with the whole circuit surface of the IC chip, in order to protect the circuit of the IC chip from α-ray. The α-ray shielding coating film and the spacer formed of the α-ray shielding rubber sheet should be selected on the criterion of α-ray dose less than 0.001 count cm$^2$·hrs. Further the α-ray shielding coating film should have a thickness more than 50 μm.

In the present invention, since potting resin is not used, lead forming can be carried out easily without being hindered by protruded potting resin layer. Further since the chip-carrier can be fabricated without the process of heat-curing of potting resin, reliability of the

DETAILED DESCRIPTION OF THE INVENTION

The present invention will be explained with reference to FIGS. 1 to 4.

Figure 1:
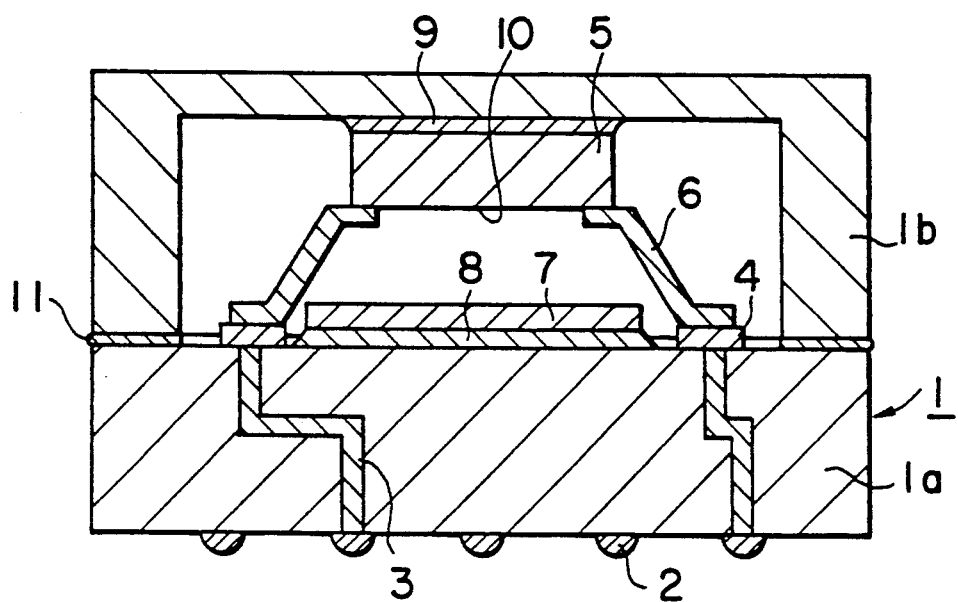
FIG. 1 is a cross section of one embodiment of a chip-carrier according to the present invention.

FIG. 1 is a cross section of one embodiment of a chip-carrier according to the present invention.

Referring to FIG. 1, a chip-carrier comprises a chip-carrier package 1. The chip-carrier package 1 comprises a chip-carrier substrate 1a and a chip-carrier cover or chip-carrier cap 1b having an inverted "U" shape in cross section. An IC chip 5 is packaged in the chip-carrier cover 1. The chip-carrier substrate 1b is provided with plural pads 4 on the upper side of the chip-carrier substrate and with input and output bumps 2 connected with the pads 4 by way of through-hole wires 3 on the under side of the chip-carrier substrate.

On the area of the chip-carrier substrate 1 facing at least the circuit surface 10 of the IC chip 5, an α-ray shielding film 7 is provided through an adhesive layer 8, in order to protect the IC chip 5 against radiation damage caused by α-ray radiated from radioactive material contained in the chip-carrier substrate 1a. The IC chip 5 is mounted on the chip-carrier substrate 1a through lead-formed leads 6. One ends of the respective leads 6 are connected to the corresponding electrodes (not shown) of the IC chip 5, while the other ends of the respective leads 6 are connected to the corresponding pads 4 provided on the upper surface of the chip-carrier substrate 1a. In order to mount the IC chip 5 on the chip-carrier substrate 1a, first, the leads 6 are connected to the corresponding electrodes of the IC chip 5, for example by tape automated bonding, then the leads 6 are lead-formed in such a manner that the other ends of the respective leads are directed toward the corresponding pads 4, as shown in FIG. 1. Then, the other ends of the respective leads 6 are connected to the corresponding pads 4 by thermocompression bonding. Thereby the IC chip 5 is arranged at a distance from the chip-carrier substrate 1a through the lead-formed leads 6 with a circuit surface 10 of the IC chip 5 being directed toward the chip-carrier substrate 1a.

In the above-mentioned embodiment of the present invention, as the α-ray shielding film 7, use can be made of, for example, polyimide resin film containing few radioactive elements of uranium, thorium or the like as impurities, as Kapton (trade mark) 200H manufactured by Toray Dupon Co., Ltd., or the like selected on the criterion of α-ray dose less than 0.001 count/cm²·hrs. For shielding α-ray dose radiated from radioactive material contained in the chip-carrier substrate 1a, a thickness of the α-ray shielding film 7 should be more than 50 μm, and should have an area greater than an area of the circuit surface 10 of the IC chip 5.

In order to assemble the above-mentioned chip-carrier 1, first, the IC chip 5 is mounted face down on the chip-carrier substrate 1a as above-mentioned. Then, the IC chip 5 is die-bonded to the chip-carrier cover 1b through an adhesive layer 9, and an edge of an opening of the chip-carrier cover 1b is adhered to the upper surface of the chip-carrier substrate 1a through an adhesive layer 11 so that the chip-carrier is finished, thereby the IC chip being packaged hermetically in the chip-carrier package 1.

Accordingly, in the chip-carrier constructed as above-mentioned according to the present invention, since the α-ray shielding film 7 is disposed on a portion of the chip-carrier substrate 1a facing at least the circuit surface 10 of the IC chip 5, an α-ray radiated from radioactive material contained in the chip-carrier substrate 1a is blocked by the α-ray shielding film 7. Therefore, it is possible to surely prevent the occurrence of soft error of the IC chip 5. Further even when bonding of the α-ray shielding film 7 to the chip-carrier substrate 1b is carried out by heat, heat used for bonding cannot be transferred to the IC chip 5, therefore reliability of the IC chip being improved, because the α-ray shielding film 7 is not adhered to the IC chip 5. Furthermore, since there is not anything as conventional potting resin on the circuit surface 10 of the IC chip 5, the leads 6 can be easily lead-formed without being hindered by the α-ray shielding film 7.

Then the second embodiment of a chip-carrier according to the present invention will be explained.

Figure 2:
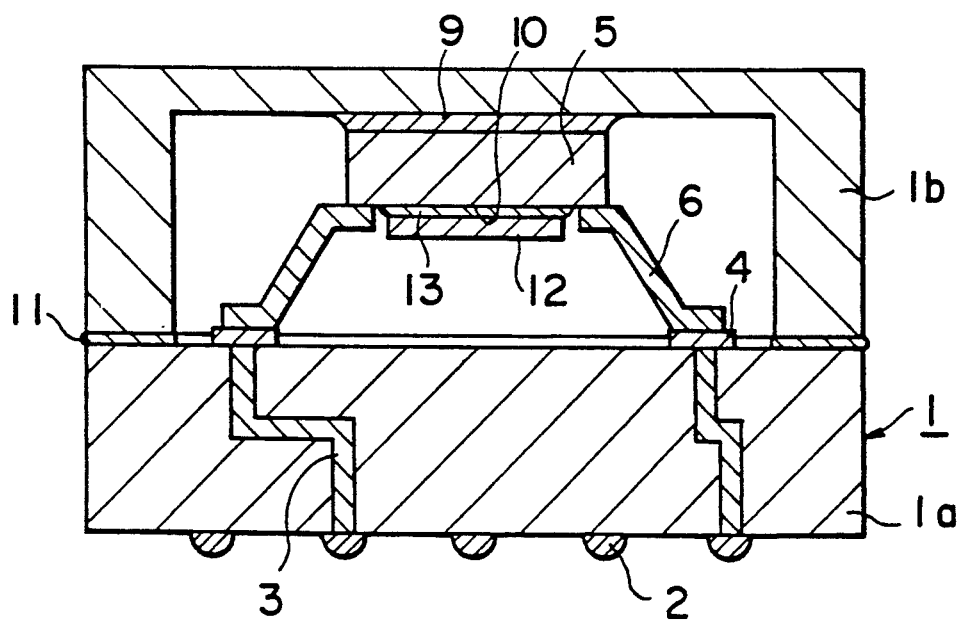
FIG. 2 is a cross section of another embodiment of a chip-carrier according to the present invention.

FIG. 2 is a cross section of the second embodiment of the present invention.

In FIG. 2, like or equal elements as in FIG. 1 are given same reference numerals as in FIG. 1, and description about these elements is omitted.

In the FIG. 2 embodiment, an α-ray shielding film 12 is provided on the circuit surface 10 of the IC chip 5 through an adhesive layer 13. As the α-ray shielding film 12, use can be made of, for example, polyimide resin film containing few radioactive elements or uranium, thorium or the like as impurities, as Kapton (trade mark) 200H manufactured by Toray Dupon Co., Ltd., or the like selected on the criterion of α-ray dose less than 0.001 count/cm²·hrs. For shielding α-ray dose radiated from radioactive material contained in the chip-carrier substrate 1a, a thickness of the α-ray shielding film 12 should be more than 50 μm, and should have an area covering an area of the circuit surface 10 of the IC chip 5.

Further as the adhesive layer 13, use can be made of, for example, silicone resin layer containing few radioactive elements of uranium, thorium or the like as impurities, as JCR 6100 manufactured by Toray Silicone Co., Ltd., or the like selected on the criterion of α-ray dose less than 0.001 count/cm²·hrs.

When the α-ray shielding film 12 is adhered to the IC chip 5 by way of the adhesive layer 13 in such a manner, α-ray radiated from radioactive material contained in the chip-carrier substrate can be blocked by the α-ray shielding film 12. Therefore it is possible to surely prevent the occurrence of soft error of the IC chip 5. Although the α-ray shielding film 12 is provided on the IC chip, since the α-ray shielding film 12 is flat and the thickness thereof is uniform over the whole area thereof, the leads 6 can be easily lead-formed without being hindered by the α-ray shielding film 12.

Then the third embodiment of a chip-carrier according to the present invention will be explained.

Figure 3:
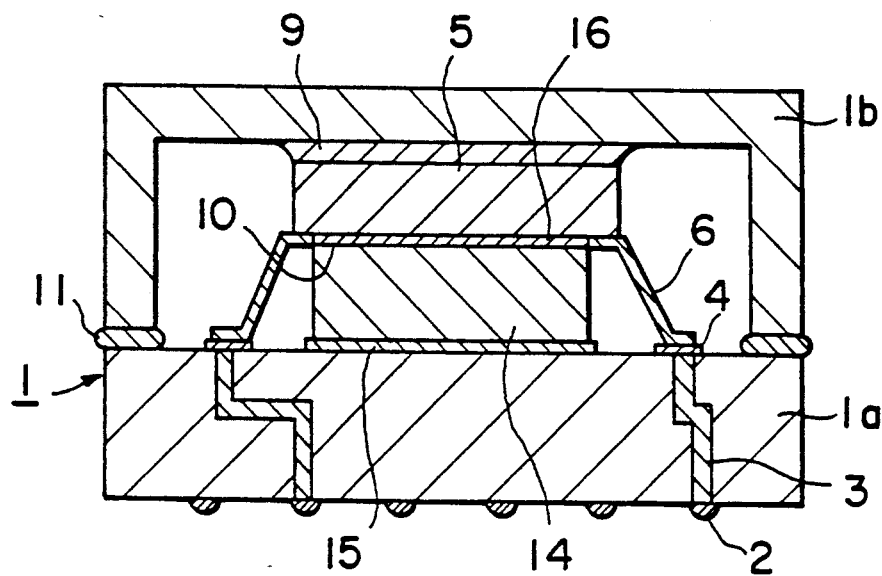
FIG. 3 is a cross section of further embodiment of a chip-carrier according to the present invention.

FIG. 3 is a cross section of the second embodiment of the present invention.

In FIG. 3, like or equal elements as in FIG. 1 are given same reference numerals as in FIG. 1, and description about these elements is omitted.

In the FIG. 3 embodiment, a spacer 14 is interposed between the TAB (Tape Automated Bonding) IC chip 5 and the chip-carrier substrate 1a, and made to come closely into contact with the whole circuit surface 10 of the TAB IC chip 5. The spacer 14 is formed of silicone rubber sheet, and has an α-ray shielding coating film 16 made of α-ray shielding silicone resin as, for example, JCR 6110 manufactured by Toray Silicone Co., Ltd., or TSJ 3130 manufactured by Toshiba Silicone Co., Ltd., or the like selected on the criterion of α-ray dose less than 0.001 count/cm$^2$·hrs. The α-ray shielding silicone resin is coated on the surface of the spacer 14 facing the IC chip 5, and heat-cured. For shielding α-ray dose radiated from radioactive material contained in the chip-carrier substrate 1a, a thickness of the α-ray shielding coating film 16 should be more than 50 μm.

In the above-mentioned chip-carrier 1, α-ray radiated from radioactive material contained in the chip-carrier substrate 1a, the spacer 14 and the leads 6 can be blocked by the α-ray shielding coating film 16. Therefore, it is possible to surely prevent the occurrence of soft error of the IC chip 5.

Further, in the FIG. 3 embodiment, since the thickness of the spacer 14 with the α-ray shielding coating film 16 can be set with a given measure, a distance between the IC chip 6 and the chip-carrier substrate 1a can be set to an equal distance, therefore lead-forming easily carried out.

Further, in the FIG. 3 embodiment, since it is not necessary to coat and heat-cure silicone resin on the IC chip 5, heat is not applied to the IC chip, therefore reliability of the IC chip being improved.

Then, in the process of manufacturing a chip-carrier 1 of the FIG. 3 embodiment, the spacer 14 is adhered to the chip-carrier substrate 1a by way of an adhesive layer 15. Then the TAB IC chip 5 with lead-formed leads 6 is disposed on the spacer 14. Thereafter the leads 6 are connected to the pads 4 by thermocompression bonding. Further the IC chip 5 is die-bonded to the chip-carrier cover 1b and thereafter the chip-carrier cover 1b is bonded to the chip-carrier substrate 1a.

Further in the FIG. 3 embodiment, the spacer 14 is manufactured as follows: silicone resin is coated to a given thickness on a silicone rubber sheet with a given thickness by a spin-coater and heat-cured; then the silicone rubber sheet with the silicone resin coating film is cut into a given shape.

Then the fourth embodiment of a chip-carrier according to the present invention will be explained.

Figure 4:
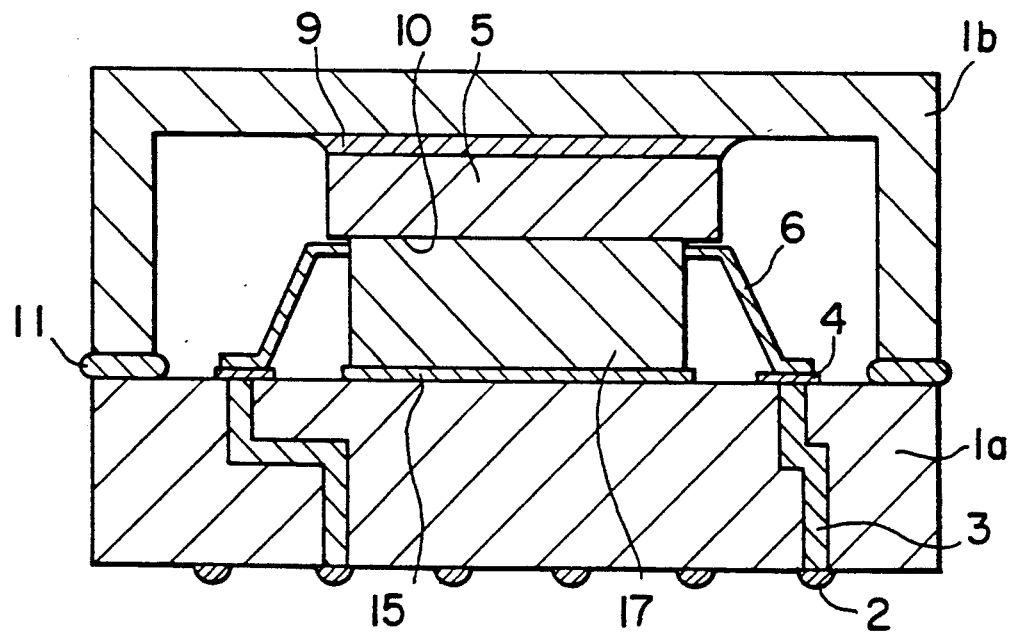
FIG. 4 is a cross section of further embodiment of a chip-carrier according to the present invention.

FIG. 4 is a cross section of the fourth embodiment of the present invention.

In FIG. 4, like or equal elements as in FIG. 1 are given same reference numerals as in FIG. 1, and description about these elements is omitted.

In the FIG. 4 embodiment, a spacer 17 is interposed between the TAB IC chip 5 and the chip-carrier substrate 1a and made to come closely into contact with the whole circuit surface 10 of the IC chip 5. The spacer 17 is formed of α-ray shielding silicone rubber sheet as, for example, JCR 6110 manufactured by Toray Silicone Co., Ltd., or TSJ 3130 manufactured by Toshiba Silicone Co., Ltd., or the like selected on the criterion of α-ray dose less than 0.001 count/cm$^2$·hrs. The spacer 17 is adhered to the chip-carrier substrate 1a through an adhesive layer 15. The α-ray shielding rubber sheet has a thickness more than 50 m at which α-ray dose radiated from radioactive material contained in the chip-carrier substrate 1a can be blocked.

In the process of fabricating a chip-carrier, first, the leads 6 are lead-formed. Thereafter the TAB IC chip 5 is placed face down on the spacer 17. Then ends of the leads 6 are bonded to pads 4 by thermocompression bonding. Further the TAB IC chip 7 is die-bonded to the chip-carrier cover 1b through an adhesive layer 9. Thereafter the chip-carrier cover 1b is hermetically adhered to the chip-carrier substrate 1b.

Since the spacer 17 made of α-ray shielding silicone rubber sheet is made to come closely into contact with the whole circuit surface 10 of the TAB IC chip 5, α-ray radiated from radioactive material contained in the chip-carrier substrate 1a and the leads 6 can be blocked. Further, since the spacer 17 is fixed to the chip-carrier substrate 1a, lead-forming can be easily carried out. Further since unnecessary heat is not applied to the TAB IC chip 5, reliability of the TAB IC chip 5 is good.

Further since the spacer 17 is fixed to the chip-carrier substrate 1a and made to come closely into contact with the TAB IC chip 5, the TAB IC chip 5 can be supported by the spacer 17, thereby being die-bonded thoroughly to the chip-carrier cover 1b.

What is claimed is:

1. A chip-carrier which comprises a chip-carrier substrate, a chip-carrier cover adhered to a surface of said chip carrier substrate, an IC chip having a circuit surface directed toward the chip-carrier substrate and being die-bonded to said chip-carrier cover and arranged at a distance from the chip-carrier substrate, leads rising between the circuit surface of the IC chip and the surface of said chip-carrier substrate, and being electrically connected between the IC chip and the chip-carrier substrate, and a spacer being interposed between the IC chip and the chip-carrier substrate and being provided in close and direct contact between its surface and the whole circuit surface of the IC chip, and said spacer being formed of an α-ray shielding rubber sheet containing few radioactive elements and which gives off an α-ray amount less than 0.001 counts/cm$^2$·hrs, and adhered to the chip-carrier substrate through an adhesive layer.

2. A chip-carrier as claimed in claim 1, wherein aid spacer is composed of a material selected from a group consisting of polyimide resin and silicon resin which contain few radioactive elements and which gives off an α-ray amount less than 0.001 count/cm$^2$·hrs.

* * * * *